United States Patent
Ohnishi

(10) Patent No.: US 9,797,066 B2
(45) Date of Patent: Oct. 24, 2017

(54) SUSCEPTOR AND METHOD FOR MANUFACTURING EPITAXIAL WAFER

(75) Inventor: Masato Ohnishi, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 711 days.

(21) Appl. No.: 13/824,731

(22) PCT Filed: Nov. 10, 2011

(86) PCT No.: PCT/JP2011/006284
§ 371 (c)(1),
(2), (4) Date: Mar. 18, 2013

(87) PCT Pub. No.: WO2012/066752
PCT Pub. Date: May 24, 2012

(65) Prior Publication Data
US 2013/0180447 A1    Jul. 18, 2013

(30) Foreign Application Priority Data

Nov. 15, 2010 (JP) ................................ 2010-255313

(51) Int. Cl.
*C30B 25/12* (2006.01)
*C23C 16/458* (2006.01)
(Continued)

(52) U.S. Cl.
CPC .......... *C30B 25/12* (2013.01); *C23C 16/4581* (2013.01); *C23C 16/46* (2013.01);
(Continued)

(58) Field of Classification Search
CPC . Y10T 117/10; C30B 25/12; H01L 21/68735; A61N 1/362; A61N 1/3756; C23C 16/4581; C23C 16/46
See application file for complete search history.

(56) References Cited

U.S. PATENT DOCUMENTS 5,474,612 A * 12/1995 Sato .................. C23C 16/45521
118/725
2003/0124820 A1* 7/2003 Johnsgard ............. C23C 16/455
438/482

(Continued)

FOREIGN PATENT DOCUMENTS

CN    1526158 A    9/2004
CN    1864245 A    11/2006

(Continued)

OTHER PUBLICATIONS

Feb. 10, 2015 Office Action and Search Report issued in Chinese Application No. 201180054726.8.

(Continued)

*Primary Examiner* — Robert M Kunemund
*Assistant Examiner* — Hua Qi
(74) *Attorney, Agent, or Firm* — Oliff PLC

(57) ABSTRACT

A susceptor is disclosed that can increase a heat capacity of a susceptor outer peripheral portion by enlarging the thickness of the susceptor and equalize thermal conditions for an outer peripheral portion and the inner peripheral portion of a wafer and a method for manufacturing an epitaxial wafer that uses this susceptor to perform vapor-phase epitaxy of an epitaxial layer. Back surface depositions have a close relationship with heat transfer that occurs between a wafer and a susceptor, i.e., a wafer outer peripheral portion has a higher temperature than a wafer inner peripheral portion since the wafer is in contact with or close to the susceptor at the wafer outer peripheral portion and hence the back surface depositions are apt to be generated. This is solved by equalizing thermal conditions for the wafer outer peripheral portion and the inner peripheral portion of the wafer back surface.

7 Claims, 5 Drawing Sheets

(51) Int. Cl.
*C23C 16/46* (2006.01)
*H01L 21/687* (2006.01)

(52) U.S. Cl.
CPC ....... *H01L 21/68735* (2013.01); *Y10T 117/00* (2015.01); *Y10T 117/10* (2015.01)

(56) References Cited

U.S. PATENT DOCUMENTS

| | | | |
|---|---|---|---|
| 2005/0000449 A1 | 1/2005 | Ishibashi et al. | |
| 2007/0119367 A1* | 5/2007 | Kanaya | C30B 25/02 117/84 |
| 2007/0227441 A1* | 10/2007 | Narahara | C23C 16/24 117/84 |
| 2010/0143579 A1 | 6/2010 | Narahara | |

FOREIGN PATENT DOCUMENTS

| | | |
|---|---|---|
| JP | H03-184325 A | 8/1991 |
| JP | H09-63966 A | 3/1997 |
| JP | A-2003-37071 | 2/2003 |
| JP | A-2003-197532 | 7/2003 |
| JP | A-2003-229370 | 8/2003 |
| JP | A-2005-515630 | 5/2005 |
| JP | A-2007-224375 | 9/2007 |
| JP | A-2007-294942 | 11/2007 |
| JP | A-2010-16183 | 1/2010 |
| JP | A-2010-141061 | 6/2010 |
| WO | 03/060967 A1 | 7/2003 |

OTHER PUBLICATIONS

Jun. 25, 2013 English translation of the International Preliminary Report on Patentability issued in International Patent Application No. PCT/JP2011/006284.
Japanese Office Action issued in Japanese Patent Application No. 2012-544100 dated Mar. 11, 2014 (with partial translation).
Jan. 24, 2012 International Search Report issued in International Application No. PCT/JP2011/006284.
Sep. 15, 2015 Office Action issued in Chinese Application No. 201180054726.8.
Mar. 22, 2017 Office Action issued in Korean Patent Application No. 10-2013-7012068.

* cited by examiner

SUSCEPTOR AND METHOD FOR MANUFACTURING EPITAXIAL WAFER

TECHNICAL FIELD

The present invention relates to a susceptor and a method for manufacturing an epitaxial wafer, and more specifically to a susceptor that can reduce depositions produced on an outer periphery of a wafer back surface at the time of an epitaxial vapor-phase growth and a method for manufacturing an epitaxial wafer using the susceptor.

BACKGROUND ART

In epitaxial growth of a silicon wafer, for the purpose of enhancing an outer periphery resistivity distribution or improving appearance of a back surface, a susceptor having through holes that penetrate to reach a susceptor back surface and are opened is often used (See Patent Document 1). Although the through holes provided in the susceptor have achieved various kinds of quality improvement, local depositions on an outer peripheral portion of a wafer back surface (hereinafter, referred to as "back surface depositions") are also produced.

Usually, a raw-material gas is allowed to flow to a wafer front side. The raw-material gas sometimes then flows into the back surface of the susceptor because of a mechanism of an epitaxial manufacturing apparatus. The raw-material gas that has flowed into the back surface side of the susceptor then flows into the back surface side of the wafer via the through holes of the susceptor and reacts on the back surface of the wafer; thus the back surface depositions are generated.

At this time, the back surface depositions of the wafer are locally generated in the vicinity of a contact portion of the susceptor and the wafer, i.e., an outer peripheral portion of the wafer back surface (in the case of a wafer having a diameter of 300 mm, a portion that is approximately 147 to 149 mm in radius from the center of the wafer), and a height thereof varies in accordance with a reaction time, but it reaches several hundred nanometers.

When flatness of the epitaxial wafer on which the back surface depositions have been produced is measured on the basis of the position of the back surface, the thickness of the epitaxial wafer precipitously increases at the outer peripheral portion, which results in flatness deterioration. In recent years, devices are miniaturized and high flatness is demanded even for a wafer outer peripheral portion, the back surface depositions can be a considerable obstacle for manufacture of latest products.

In conventional examples, the back surface depositions are intensively produced in a portion where a wafer and a susceptor are in contact with each other or they closely overlap each other, namely, a margin for mounting the susceptor, a back surface deposition height fluctuates in accordance with a thermal dose on the susceptor side, and hence a method for reducing the margin for mounting the susceptor as much as possible, a method for enlarging the margin for mounting the susceptor and continuously generating the back surface depositions, or a method for reducing lamp heating using a lamp on the lower side of the susceptor is mainly adopted in order to cope with the problem.

However, the above-described methods are effective for the back surface depositions, but they have drawbacks, e.g., slip dislocation is apt to occur, nano-topology quality on a front side is deteriorated, or outer periphery resistivity distribution quality is deteriorated.

Furthermore, Patent Document 2 discloses that a protrusion is provided at a position corresponding to a wafer outer peripheral portion on a susceptor back side, a heat capacity of the susceptor is increased, a heat keeping effect is enhanced, the wafer outer peripheral portion is heated, and occurrence of slip dislocation is thereby suppressed.

CITATION LIST

Patent Literature

Patent Document 1: Japanese Unexamined Patent publication (Kokai) No. 2003-229370
Patent Document 2: Japanese Unexamined Patent publication (Kokai) No. 2003-37071

SUMMARY OF INVENTION

Technical Problem

The present inventor has inferred from the past experimental results or experience that back surface depositions have a close relationship with heat transfer that occurs between a wafer and a susceptor, i.e., that a wafer outer peripheral portion has a higher temperature than a wafer inner peripheral portion since the wafer is in contact with the susceptor or the wafer is close to the susceptor at the wafer outer peripheral portion and hence the back surface depositions are apt to be generated, and the inventor tried solving the problem by equalizing thermal conditions for the wafer outer peripheral portion and the inner peripheral portion.

That is, to solve the above-described problem, it is an object of the present invention to provide a susceptor that can increase a heat capacity of a susceptor outer peripheral portion by enlarging the thickness of the susceptor and can equalize thermal conditions for the outer peripheral portion and the inner peripheral portion of a wafer and also to provide a method for manufacturing an epitaxial wafer configured to perform vapor-phase epitaxy of an epitaxial layer by using this susceptor.

Solution to Problem

To solve the problem, the present invention provides a susceptor for supporting a semiconductor substrate at the time of performing vapor-phase epitaxy of an epitaxial layer, wherein a pocket in which the semiconductor substrate is to be arranged is formed on an upper surface of the susceptor, the pocket has a two-stage structure having an upper-stage-pocket portion for supporting an outer peripheral edge portion of the semiconductor substrate and a lower-stage-pocket portion formed below the upper-stage-pocket portion and on a central side of the pocket, hole portions that penetrate to reach a back surface of the susceptor and are opened at the time of performing the vapor-phase growth are formed in the lower-stage-pocket portion, and a protruding portion is provided on the back surface of the susceptor at least at a position corresponding to that of the upper-stage-pocket portion.

With this configuration, since the thickness of the susceptor at the position corresponding to the upper-stage-pocket portion is increased and the heat capacity is thereby increased, the temperature at the wafer outer peripheral portion is hard to rise; therefore the thermal conditions for the wafer outer peripheral portion and inner peripheral portion can be equalized, and generation of the back surface depositions can be suppressed without deteriorating the nano-topology quality on the wafer front surface or the outer periphery resistivity distribution quality.

In this case, a thickness of the protruding portion preferably is not more than three times a thickness of the susceptor excluding the protruding portion at the position corresponding to that of the upper-stage-pocket portion.

With this configuration, since the thermal conditions for the wafer outer peripheral portion and inner peripheral portion can be further accurately equalized, the back surface depositions can be further effectively suppressed as the effect of the present invention.

Moreover, grooves are preferably formed on the protruding portion.

With such a configuration, since the portion that functions as shadow with respect to the lamp heating can be necessarily produced on the protruding portion and its surface area is increased to facilitate heat radiation, the temperature of the protruding portion can be lowered; therefore the back surface depositions can be further effectively suppressed as the effect of the present invention.

Moreover, the grooves preferably have a lattice-like pattern.

With such a configuration, the temperature of the protruding portion can be further effectively reduced, and the back surface depositions can be suppressed.

Moreover, a depth of the grooves preferably is not less than 1/10 of a thickness of the susceptor at the position corresponding to that of the upper-stage-pocket portion.

With such a configuration, the temperature of the protruding portion can be further effectively lowered, and generation of the back surface depositions can be suppressed.

The present invention also provides a method for manufacturing an epitaxial wafer, comprising: using a susceptor according the present invention to place a wafer on the pocket of the susceptor; and performing vapor-phase epitaxy of an epitaxial layer on the wafer while allowing a raw-material gas to flow.

When the vapor-phase epitaxy is carried out in this manner, an epitaxial wafer in which generation of the back surface depositions is suppressed can be manufactured without deteriorating the nano-topology quality on the wafer front surface or the outer periphery resistivity distribution quality.

Advantageous Effects of Invention

As described above, according to the present invention, at the time of subjecting the epitaxial layer to the vapor-phase epitaxy on the wafer front surface, the thermal conditions for the wafer outer peripheral portion and the inner peripheral portion can be equalized, and generation of the back surface depositions can be suppressed without deteriorating the nano-topology quality on the wafer front surface or the outer periphery resistivity distribution quality. Furthermore, when such a susceptor is used for the vapor-phase epitaxy of the epitaxial layer on the wafer front surface, an epitaxial wafer in which generation of the back surface depositions is suppressed can be manufactured.

DESCRIPTION OF EMBODIMENTS

Although embodiments according to the present invention will now be described hereinafter in detail with reference to the accompanying drawings, the present invention is not restricted thereto.

Figure 5:
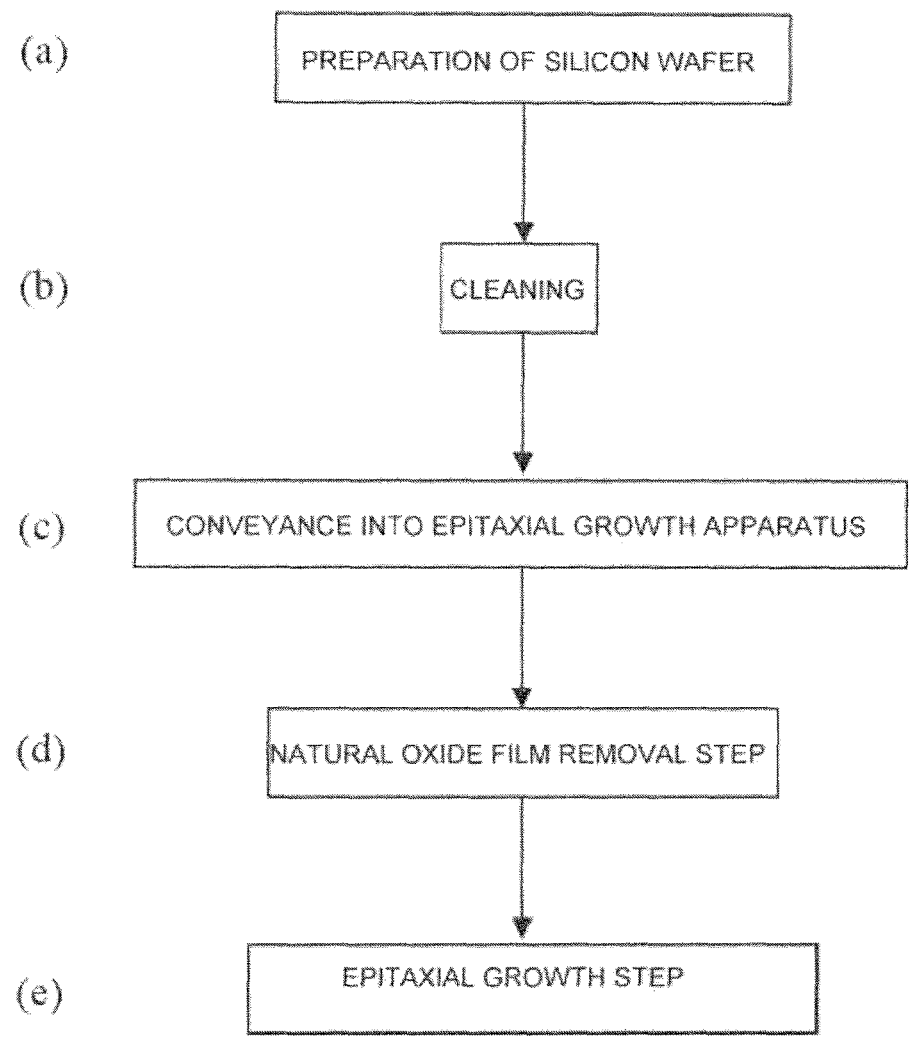
FIG. 5 is a flowchart of a method for manufacturing an epitaxial wafer to which the present invention is applied.

FIG. 5 shows a flowchart of a procedure of a method for manufacturing an epitaxial wafer to which the present invention is applied.

First, at a step (a), a wafer (a silicon wafer) on which an epitaxial layer is to be grown is prepared. Here, the present invention is not restricted to the silicon wafer, and it can be likewise used for a compound semiconductor wafer such as a silicon carbide wafer, a GaP wafer, and a GaAs wafer.

Then, at a step (b), cleaning such as RCA cleaning is appropriately performed on the silicon wafer.

As a cleaning method in this cleaning step, it is possible to apply a method using concentration or types of chemicals changed in the normal range besides the typical RCA cleaning.

Figure 1:
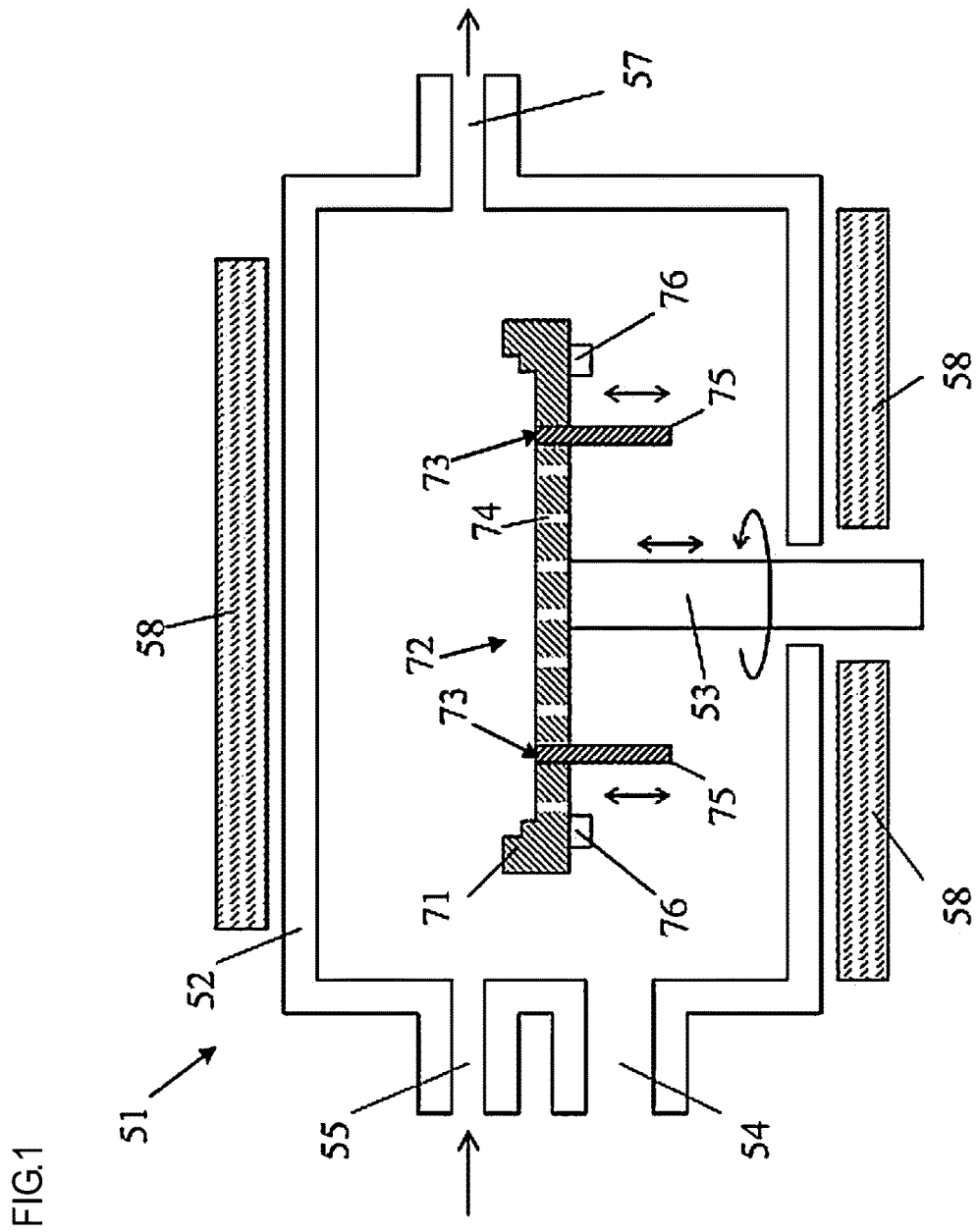
FIG. 1 shows a schematic cross-sectional view of an epitaxial growth apparatus used in the present invention.

At a step (c) and subsequent steps, the silicon wafer is transferred to an epitaxial growth apparatus for vapor-phase epitaxy. FIG. 1 shows a schematic view of an example of the epitaxial growth apparatus used at the step (c) and subsequent steps.

An epitaxial growth apparatus 51 is constituted of a chamber 52, a susceptor 71 arranged in the chamber, susceptor supporting means 53 that supports the susceptor from the lower side and is capable of rotating and moving up and down, a wafer carriage opening 54 through which a wafer is carried into the chamber 52 and carried to the outside, a gas introduction pipe 55 through which various kinds of gases are supplied into the chamber, non-illustrated hydrogen gas supplying means, connected to the gas introduction pipe 55, for supplying a hydrogen gas into the chamber, non-illustrated raw-material gas supplying means, connected to the gas introduction pipe 55, for supplying a raw-material gas such as silane, a gas discharge pipe 57 through which various kinds of gases are discharged from the chamber, heating means 58 provided outside the chamber 52, non-illustrated wafer transferring means for transferring a silicon wafer into the chamber and transferring the silicon wafer from the chamber 52, and others.

It is to be noted that lift pin through holes 73 may be formed in the susceptor 71. A lift pin 75 is inserted into each lift pin through hole 73.

Moreover, lift pin elevating means that can relatively move up and down each lift pin 75 with respect to the susceptor may be provided in the chamber 52.

Figure 2:
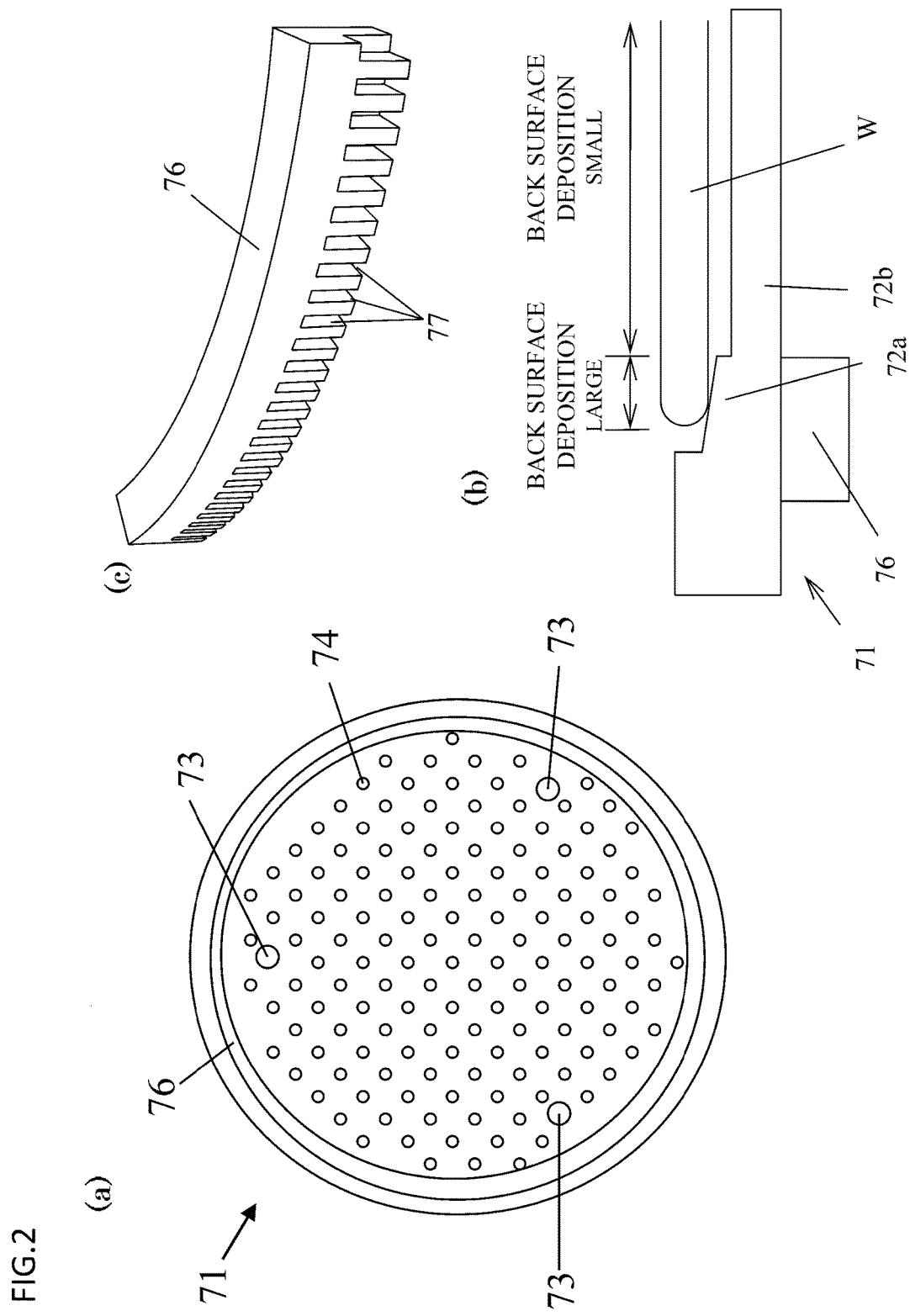
FIG. 2 shows a schematic bottom view and a schematic cross-sectional view of a susceptor of the present invention, and an enlarged view of a part of protruding portions.

Additionally, FIG. 2 shows an enlarged schematic view of the susceptor 71 according to the present invention. FIG.

2(a) is a bottom view, and FIG. 2(b) is a cross-sectional view. Further, FIG. 2(c) is an enlarged view of a part of a protruding portion 76.

A pocket 72 for positioning of a silicon wafer to be placed is formed on the susceptor 71, and the pocket 72 has a two-stage structure having an upper-stage-pocket portion 72a that supports an outer peripheral edge portion of a wafer W and a lower-stage-pocket portion 72b formed below the upper-stage-pocket portion and on the center side of the pocket. Furthermore, many through holes 74 are formed in a substantially entire surface of the lower-stage-pocket portion 72b.

Moreover, a protruding portion 76 (which may be also referred to as a block hereinafter) is provided on the susceptor back surface at a position corresponding to the upper-stage-pocket portion.

It is to be noted that the protruding portion 76 may be formed by pressing a block-like protrusion against the susceptor back surface or may be formed in advance on the susceptor back surface by a back surface processing when a susceptor itself is formed.

Since the protruding portion 76 is provided to increase the thickness of the susceptor at the position corresponding to the upper-stage-pocket portion and its heat capacity, the temperature of this portion is hard to increase, and thermal conditions for the wafer outer periphery portion and the inner periphery portion can be equalized; therefore generation of back surface depositions can be suppressed without deteriorating non-topology quality of a wafer main front side or outer periphery resistivity distribution quality.

Moreover, when the thickness of the protruding portion 76 is not more than three times the thickness of the susceptor excluding the protruding portion at the position corresponding to that of the upper-stage-pocket portion, damage to the susceptor at the time of heating caused due to a too high heat capacity difference can be avoided.

Additionally, as shown in FIG. 2(c), it is possible to use a susceptor having a protruding portion with grooves 77. Further, a susceptor with the grooves 77 having a lattice-like pattern can be used. Furthermore, it is possible to use a susceptor in which the depth of each groove 77 is not less than 1/10 of the thickness of the susceptor at the position corresponding to the upper-stage-pocket portion.

Since the grooves 77 are formed on the protruding portion 76, a portion that serves as shadow with respect to lamp heating can be necessarily generated on the protruding portion, the grooves 77 enlarge its surface area to facilitate heat radiation, and the temperature of the protruding portion can thus be reduced, suppression of the back surface depositions as the effect of the present invention can be facilitated. Further, when the susceptor with the grooves 77 having a lattice-like pattern is used, or when the susceptor in which the depth of each groove 77 is not less than 1/10 of the thickness of the susceptor at the position corresponding to the upper-stage-pocket 72a is used, the back surface depositions can be further effectively suppressed.

An epitaxial growth apparatus 51 including such a susceptor 71 is used to grow an epitaxial layer by vapor-phase epitaxy on the silicon wafer surface as follows.

First, at a step (c), non-illustrated wafer transferring means is used to transfer a silicon wafer into the chamber 52, and the silicon wafer is placed on the pocket 72 of the susceptor 71. As a method for placing the silicon wafer on the susceptor 71, it is possible to apply a normally used placing method as well as a method using the lift pins 75.

Then, at a natural oxide film removal step (d), a hydrogen gas is introduced into the chamber 52 from the hydrogen gas supplying means through the gas introduction pipe 55, the interior of the chamber is heated by the heating means 58 for hydrotreating, so that a natural oxide film produced on the silicon wafer front surface is removed.

Then, at a step (e), the vapor-phase epitaxy of the epitaxial layer is carried out on the front surface of the silicon wafer. This vapor-phase epitaxy of the epitaxial layer is performed by introducing a raw-material gas such as monosilane, trichlorosilane, and silicon tetrachloride and the hydrogen gas which is used as a carrier gas into the chamber 52 and heating the interior of the chamber.

In this manner, the epitaxial wafer having the epitaxial layer formed on the front surface of the silicon wafer can be manufactured. In the epitaxial growth apparatus used in this embodiment, since the protruding portion is provided on the portion of the susceptor back surface corresponding to the upper-stage-pocket portion, the thickness of the susceptor at the position corresponding to that of the upper-stage-pocket portion increases and the heat capacity is also increased, thermal conditions for the wafer outer peripheral portion and the inner peripheral portion can be equalized, and generation of the back surface depositions can be suppressed without deteriorating the nano-topology quality of the wafer main surface and the outer periphery resistivity distribution quality.

Although the present invention will now be more specifically explained based on an experimental example, the present invention is not restricted thereto.

EXPERIMENTAL EXAMPLE

Figure 4:
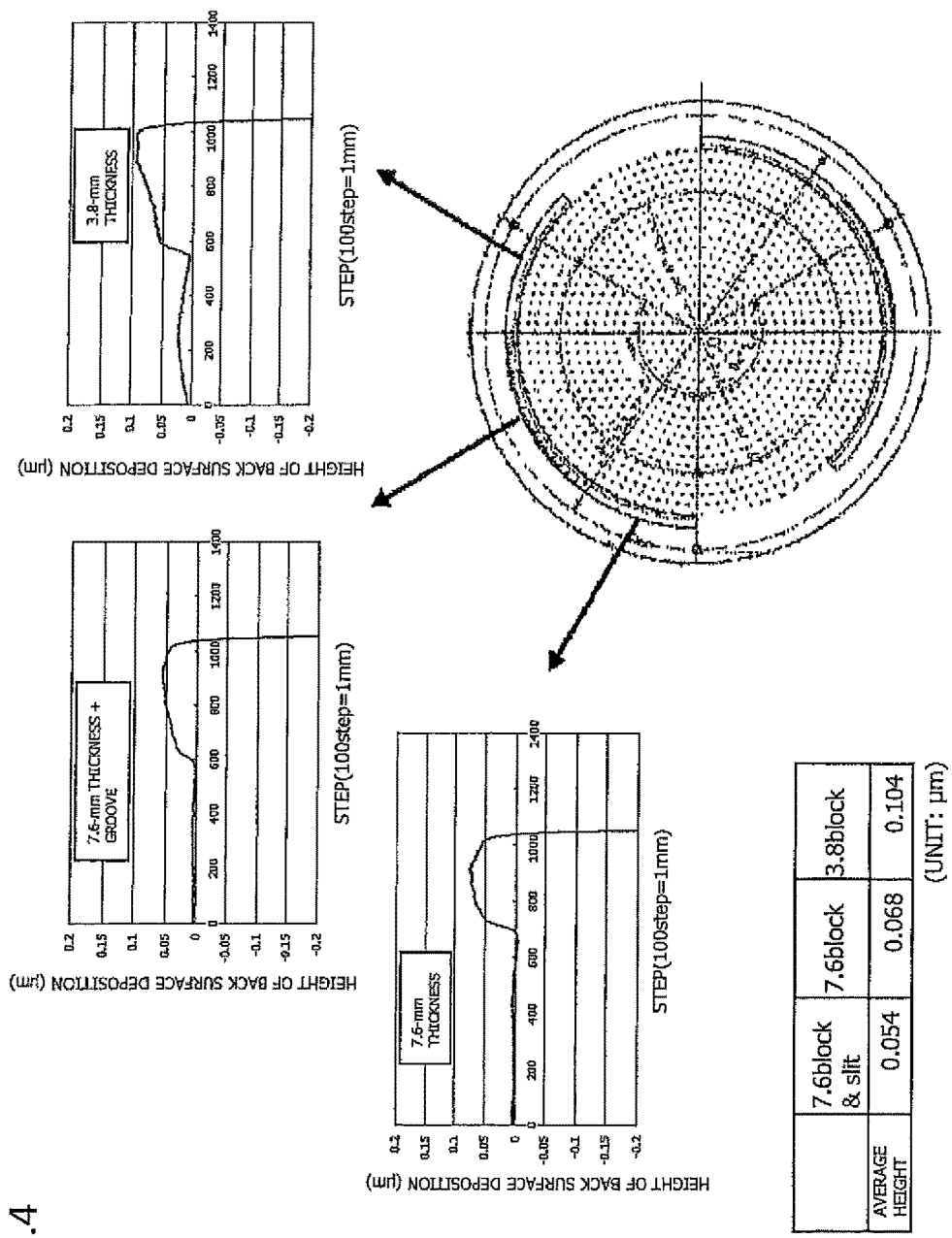
FIG. 4 shows a result of performing the vapor-phase epitaxy of an epitaxial layer on the wafer front surface by using the susceptor according to the present invention and evaluating its wafer back surface using UA3P in Experimental Example of the present invention.

In the epitaxial growth apparatus in which a silicon wafer is placed on the pocket of the susceptor and the vapor-phase epitaxy of an epitaxial layer is performed on the front surface of the silicon wafer while allowing a raw-material gas to flow, as shown in FIG. 4, a 3.8-mm-thickness block, a 7.6-mm-thickness block, a 7.6-mm-thickness block formed with grooves having a depth of 3.8 mm, and a portion having no block were equally provided on a circumferential portion on the back surface of one susceptor at the position corresponding to that of an 4-mm-thickness upper-stage-pocket portion. The vapor-phase epitaxy of an epitaxial layer with a thickness of 5 μm was performed on the front surface of the silicon wafer having a diameter of 300 mm under a normal reaction pressure at a reaction temperature of 1100° C. and a growth rate of 2.7 μm/min. As a result, the effect of the present invention was able to be verified while completely meeting conditions other than, e.g., presence/absence of the protruding portion on the susceptor back surface.

Figure 3:
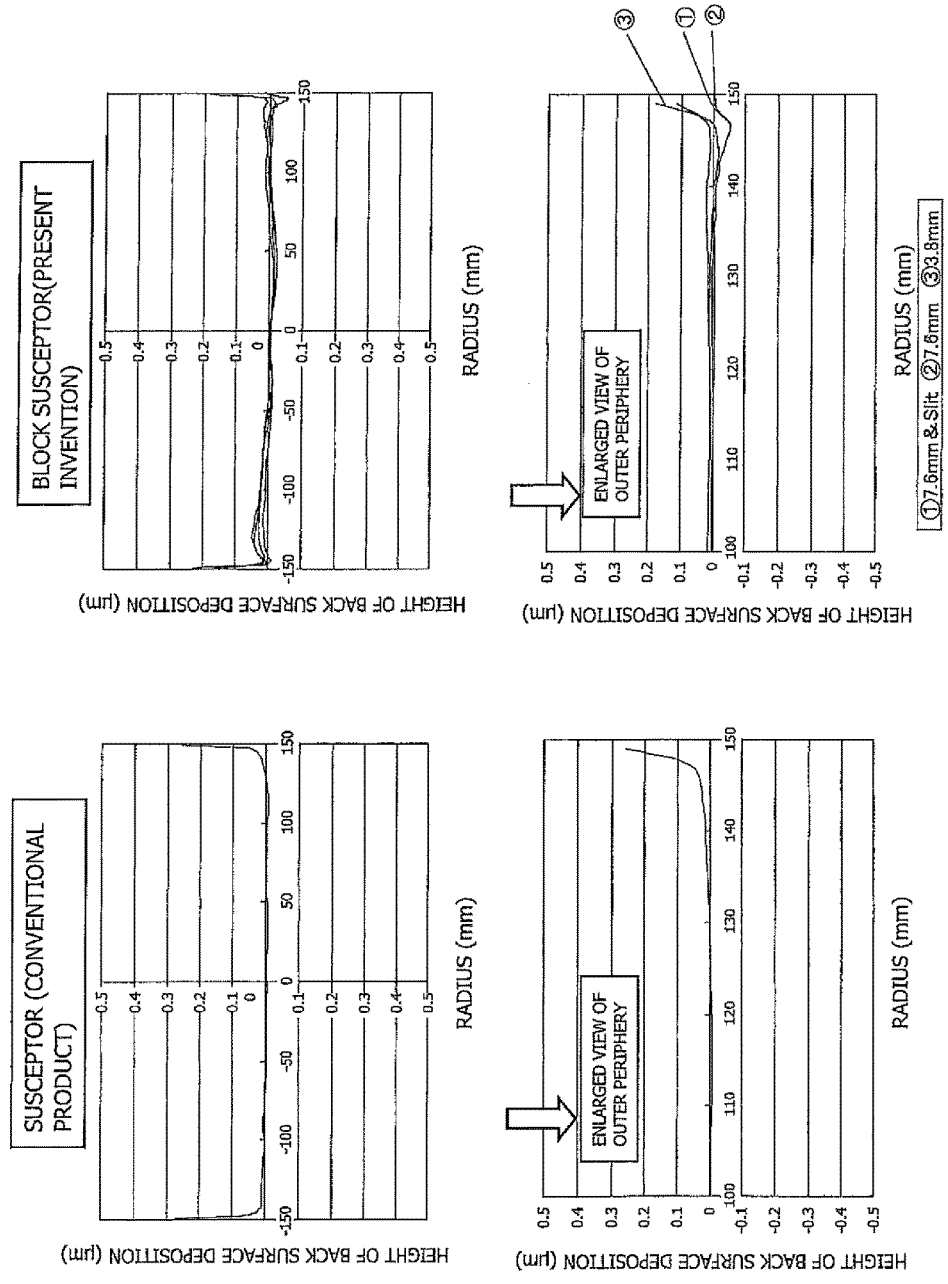
FIG. 3 shows a result of performing vapor-phase epitaxy of the epitaxial layer on the wafer front surface by using each of a conventional susceptor and the susceptor according to the present invention and evaluating each wafer back surface using WaferSight in Experimental Example of the present invention.

At this time, in a range of approximately 145 mm to 149 mm in radius from the center of the silicon wafer back surface, i.e., the silicon wafer back surface in a range corresponding to the back surface of the susceptor on which the protruding portion was provided according the present invention was evaluated using an evaluating apparatus such as WaferSight (manufactured by Panasonic Corporation) and UA3P (manufactured by KLA-Tencor Corporation), and the height of the back surface depositions was measured. FIG. 3 shows a measurement result obtained by WaferSight, and FIG. 4 shows a measurement result obtained by UA3P in this example. Table 1 shows results of this experiment.

Here, WaferSight is a measuring instrument that measures, in principle, a displacement of the wafer front surface from the number and width of interference fringes produced due to optical interference of reflected light from the wafer and reflected light from a reference surface when light is allowed to enter the wafer. In the actual measurement, both the wafer surfaces are measured, and a change in entire thickness is calculated from the thickness of one specific point measured in advance.

Furthermore, UA3P is a measuring instrument that conducts measurement on the basis of a contact surface displacement. It presses a probe against a target under a small constant load and measures with a laser a displacement of the probe that fluctuates in accordance with irregularities of the target in principle.

TABLE 1

|  | 7.6-mm-thickness block and grooves | 7.6-mm-thickness block | 3.8-mm-thickness block | Conventional susceptor |
|---|---|---|---|---|
| Height of back surface depositions (WS) | 0.108 | 0.109 | 0.156 | 0.225 |
| Height of back surface depositions (UA3P) | 0.054 | 0.068 | 0.104 | 0.126 |

Unit: μm

As can be understood from FIG. 3, FIG. 1, and Table 1, heights of the back surface depositions on the susceptor having the blocks according to the present invention are lower than that of the conventional susceptor portion having no block on a portion corresponding to the upper-stage-pocket portion on the back surface. Further, even when the blocks are provided on the back surface of the susceptor, the susceptor can be prevented from being damaged upon heating due to an extremely large heat capacity difference as long as the thickness of each block is not more than three times the thickness of the susceptor excluding the protruding portion at the position corresponding to the upper-stage-pocket portion. Furthermore, when the grooves are formed in the block, the portion that functions as shadow with respect to lamp heating can be necessarily formed on the block, the surface with an increased surface area is easy to radiate heat, and hence the temperature of the block can be reduced; thus effectively suppressing generation of the back surface depositions. At this time, the experimental result obtained from the portion having no block is the same as that acquired when a conventional susceptor having no circumferential protruding portion was used to perform the vapor-phase epitaxy of the epitaxial layer under the same conditions as the above epitaxial growth conditions.

It is to be noted that the present invention is not restricted to the foregoing embodiment. The foregoing embodiment is an illustrative example, and any example that has substantially the same configuration and exercises the same functions and effects as the technical concept described in claims is included in the technical scope of the present invention.

The invention claimed is:

1. A susceptor for supporting a semiconductor substrate at the time of performing vapor-phase epitaxy of an epitaxial layer, wherein a pocket in which the semiconductor substrate is to be arranged is formed on an upper surface of the susceptor, the pocket has a two-stage structure having an upper-stage-pocket portion for supporting an outer peripheral edge portion of the semiconductor substrate and a lower-stage-pocket portion formed below the upper-stage-pocket portion and on a central side of the pocket, hole portions that penetrate to reach a back surface of the susceptor and are opened at the time of performing the vapor-phase growth are formed in the lower-stage-pocket portion, and a protruding portion is provided on the back surface of the susceptor at least at a position corresponding to that of the upper-stage-pocket portion and along the entire periphery of said back surface of the susceptor,
wherein a thickness of the protruding portion is not more than three times the thickness of the susceptor excluding the protruding portion at the position corresponding to that of the upper-stage-pocket portion.

2. The susceptor according to claim 1,
wherein grooves are formed on the protruding portion.

3. The susceptor according to claim 2,
wherein the grooves have a lattice-like pattern.

4. The susceptor according to claim 2,
wherein a depth of the grooves is not less than $1/10$ of a thickness of the susceptor at the position corresponding to that of the upper-stage-pocket portion.

5. The susceptor according to claim 3,
wherein a depth of the grooves is not less than $1/10$ of a thickness of the susceptor at the position corresponding to that of the upper-stage-pocket portion.

6. A method for manufacturing an epitaxial wafer, comprising: using a susceptor according to claim 5 to place a wafer on the pocket of the susceptor; and performing vapor-phase epitaxy of an epitaxial layer on the wafer while allowing a raw-material gas to flow.

7. A method for manufacturing an epitaxial wafer, comprising: using a susceptor according to claim 1 to place a wafer on the pocket of the susceptor; and performing vapor-phase epitaxy of an epitaxial layer on the wafer while allowing a raw-material gas to flow.

* * * * *